United States Patent [19]

Wang

[11] Patent Number: 5,364,562

[45] Date of Patent: Nov. 15, 1994

[54] AEROSOL-PLASMA DEPOSITION OF INSULATING OXIDE POWDER

[76] Inventor: Xingwu Wang, 113 N. Main St., Alfred, N.Y. 14802

[21] Appl. No.: 120,565

[22] Filed: Sep. 13, 1993

Related U.S. Application Data

[63] Continuation-in-part of Ser. No. 871,278, Apr. 20, 1992, Pat. No. 5,260,105, which is a continuation-in-part of Ser. No. 510,011, Apr. 17, 1990, Pat. No. 5,120,703.

[51] Int. Cl.$^5$ ............................................. C09K 3/30
[52] U.S. Cl. .................................. 252/305; 252/521; 423/593
[58] Field of Search ............... 427/62, 63; 252/305, 252/500, 521; 505/1, 780; 423/593

[56] References Cited

U.S. PATENT DOCUMENTS 5,160,664  11/1992  Liu ...................................... 252/305

OTHER PUBLICATIONS

Tohge et al, "Direct preparation of fine powders of the 80K superconducting phase in the Bi—Ca—Sr—Cu—O system by spray pyrolysis", Jpn. J. Appl. Phys. 28(7) Jul., 1989 pp. L1175–L1178.

Kodas et al, "Aerosol flow reactor production of fine $YiBa_2Cu_3O_7$ powder: Fabrication of superconducting ceramics", Appl. Phys. Lett. 52(19) May 1988, pp. 1622–1624.

Gangopadhyay et al, Physica C, vol. 201, pp. 6–12 (1992).

Primary Examiner—Roy V. King
Attorney, Agent, or Firm—Howard J. Greenwald

[57] ABSTRACT

A process for preparing an insulating powder. In the first step of this process, a solution comprising a first compound (which preferably is an yttrium compound), a barium compound, and a copper compound subjected to ultrasonic sound waves at a frequency in excess of 20,000 hertz, and to a substantially atmospheric pressure of at least about 600 millimeters of mercury to cause such solution to form into an aerosol. Thereafter, a plasma is generated within a radio-frequency plasma reactor, and the aerosol is contacted with the plasma gas within the reactor while subjecting said aerosol to a substantially atmospheric pressure of at least about 600 millimeters of mercury and to a radio frequency alternating current at a frequency of from about 100 kilohertz to about to about 30 megahertz to form a vapor, which is thereafter flowed downwardly onto and collected on a collector.

10 Claims, 1 Drawing Sheet

AEROSOL-PLASMA DEPOSITION OF INSULATING OXIDE POWDER

CROSS-REFERENCE TO RELATED PATENT APPLICATIONS

This is a continuation in part of applicant's copending patent application U.S. Ser. No. 07/871,278, filed Apr. 20, 1992 now U.S. Pat. No. 5,260,105, which in turn was a continuation-in-part of application Ser. No. 07/510,011, filed on Apr. 17, 1990 now U.S. Pat. No. 5,120,703.

FIELD OF THE INVENTION

An atmospheric process, using deposition of plasma vapor, for producing powders of insulating material which may be collected in a substrate assembly.

BACKGROUND OF THE INVENTION

Material of the formula $Y_2BaCuO_5$, also referred to as the 2-1-1 phase, is known to furnish flux pinning centers in the well known 1-2-3 yttrium—barium—copper superconductor material. See, e.g., an article by A. K. Gangopadhyay et al. entitled "Flux pinning and irreversibility temperature in... superconductors" Physica C, Vol. 201, P6-P12 (1992). Thus, a 1-2-3 superconductor comprised of a 2-1-1 material dispersed therein will have a higher critical current than a comparable 1-2-3 superconductor without such 2-1-1 material therein.

Not every 2-1-1 material has the desired effect upon the 1-2-3 superconductor, however. Unless the particle size of the 2-1-1 material is less than about 100 nanometers (and preferably from about 10 to about 100 nanometers), the critical current of the 1-2-3 superconductor will not be substantially affected.

Applicant is not aware of any prior art process which enables one to make the 2-1-1 material with a particle size of less than 100 nanometers and which is suitable for large scale production, which produces the 2-1-1 material in relatively high yields, which is relatively inexpensive, and which produces substantially uniform particles sizes.

It is an object of this invention to provide a process for making a 2-1-1 material with a particle size of less than 100 nanometers which is suitable for large scale production, which produces the 2-1-1 material in relatively high yields, which is relatively inexpensive, and which produces substantially uniform particle sizes.

SUMMARY OF THE INVENTION

In accordance with this invention, there is provided an atmospheric process for the production of material of the formula $Y_2BaCuO_5$. In the first step of this process, an aerosol mist containing reactants necessary to form the desired material is provided. Thereafter, the mist is subjected to radio-frequency radiation while in the plasma region. Thereafter, the vaporized mixture is then deposited onto a collector.

BRIEF DESCRIPTION OF THE DRAWINGS

The present invention will be more fully understood by reference to the following detailed description thereof, when read in conjunction with the attached drawing, wherein like reference numerals refer to like elements, and wherein.

DESCRIPTION OF THE PREFERRED EMBODIMENTS

Figure 1:
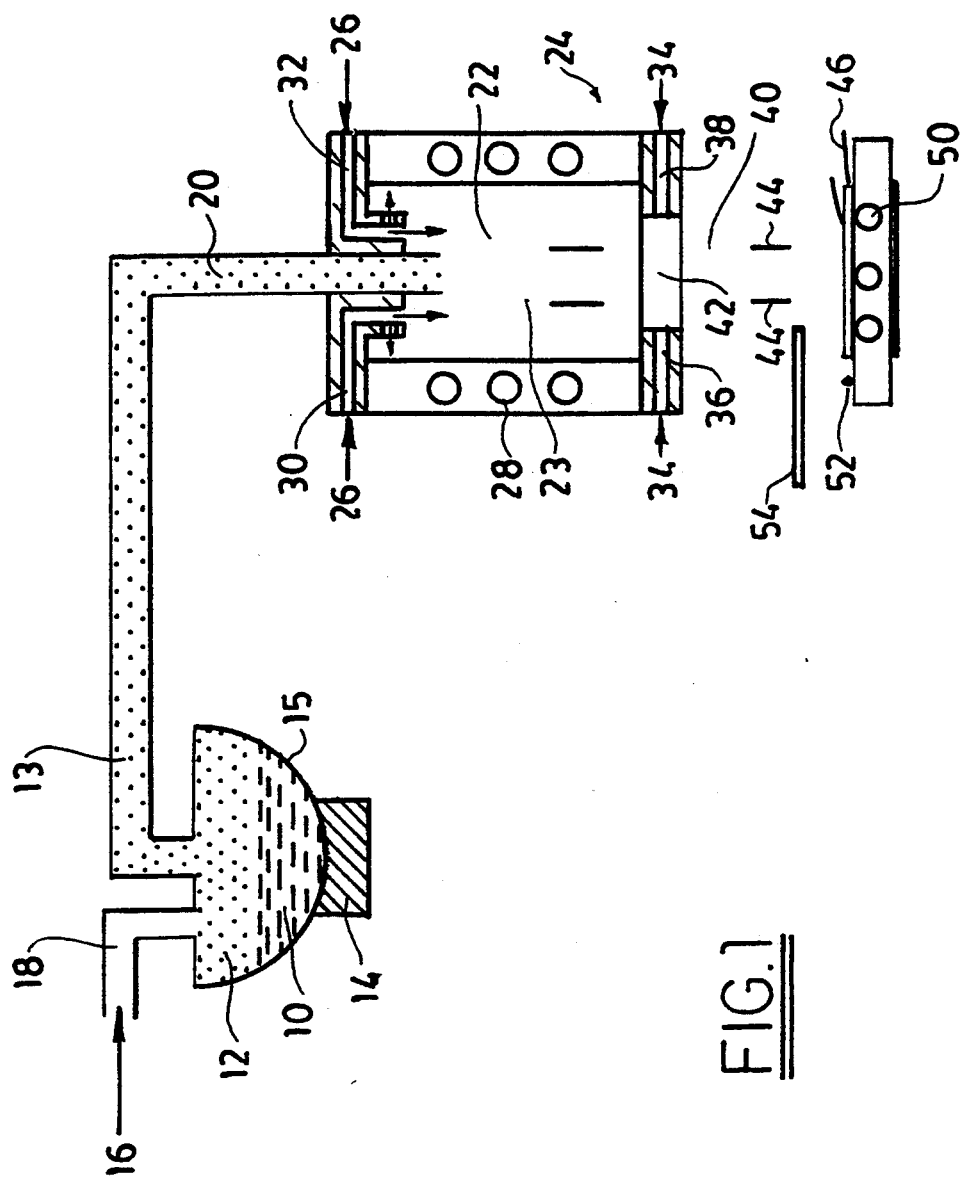
FIG. 1 is a system diagram illustrating one preferred embodiment of the process of this invention.

FIG. 1 illustrates a preferred embodiment of applicant's process. In the first step of the process, a solution 10 of reagents is charged into misting chamber 12.

The reagents charged into misting chamber 12 will be sufficient to form a layer of the desired material in the process. The nature and identity of these reagents will be discussed later in this specification after the general process is discussed.

Referring again to FIG. 1, the solution 10 in misting chamber 12 is preferably caused to form into an aerosol, such as a mist 13.

The term aerosol, as used in this specification, refers to a suspension of ultramicroscopic solid or liquid particles in air or gas, such as smoke, fog, or mist. See, e.g., page 15 of "A dictionary of mining, mineral, and related terms" edited by Paul W. Thrush (U.S. Department of the Interior, Bureau of Mines, 1968), the disclosure of which is hereby incorporated by reference into this specification. In general, the aerosol particles have diameters of from about 0.1 to about 100 microns and, preferably, less than about 10 microns.

As used in this specification, the term mist refers to gas-suspended liquid particles which have diameters less than 10 microns.

The aerosol/mist 13 consisting of gas-suspended liquid particles with diameters less than 10 microns may be produced from solution 10 by any conventional means which causes sufficient mechanical disturbance of said solution. Thus, one may use mechanical vibration. In one preferred embodiment, ultrasonic means 14 are used to mist solution 10.

As is known to those skilled in the art, ultrasonic sound waves (those having frequencies above 20,000 hertz) may be used to mechanically disturb solutions and cause them to mist. Thus, by way of illustration, one may use the ultrasonic nebulizer sold by the DeVilbiss Health Care, Inc. of Somerset, Pa.; see, e.g., the Instruction Manual for the "Ultra-Neb 99 Ultrasonic Nebulizer, publication A-850-C (published by DeVilbiss, Somerset, Pa., 1989), the disclosure of which is hereby incorporated by reference into this specification.

In the embodiment shown in FIG. 1, the oscillators of ultrasonic nebulizer 14 are shown contacting an exterior surface 15 of misting chamber 12. In this embodiment, the ultrasonic waves produced by the oscillators are transmitted via the walls of the misting chamber 12 and effect the misting of solution 10.

In another embodiment, not shown, the oscillators of ultrasonic nebulizer 14 are in direct contact with solution 10.

It is preferred that the ultrasonic power used with such machine should be in excess of one watt and, more preferably, in excess of 10 watts. In one embodiment, the power used with such machine exceeds about 50 watts.

During the time solution 10 is being caused to mist, it is preferably contacted with carrier gas to apply pressure to the solution and mist. It is preferred that a sufficient amount of carrier gas is introduced into the system at a sufficiently high flow rate so that pressure on the system is in excess of atmospheric pressure. Thus, for example, in one embodiment wherein chamber 12 has a volume of about 200 cubic centimeters, the flow rate of the carrier gas was from about 100 to about 150 milliliters per minute.

The carrier gas 16 is introduced via feeding line 18 at a rate sufficient to cause solution 10 to mist at a rate of from about 0.5 to about 20 milliliters per minute. In one embodiment, the misting rate of solution 10 was from about 1.0 to about 3.0 milliliters per minute.

Substantially any gas which facilitates the formation of plasma may be used as carrier gas 16. Thus, by way of illustration, one may use oxygen, air, argon, nitrogen, and the like. It is preferred that the carrier gas used be a compressed gas under a pressure in excess 760 millimeters of mercury. In this embodiment, the use of the compressed gas facilitates the movement of the mist from the misting chamber 12 to the plasma region 22.

The misting container 12 may be any reaction chamber conventionally used by those skilled in the art and should preferably be constructed out of such acid-resistant materials such as glass, plastic, and the like.

The mist from misting chamber 12 is fed via misting outlet line 20 into the plasma region 22 of plasma reactor 24. In plasma reactor 24, the mist is mixed with plasma generated by plasma gas 26 and subjected to radio frequency radiation provided by a radio-frequency coil 28.

The plasma reactor 24 provides energy to form plasma and to cause the plasma to react with the mist. Any of the plasmas reactors well known to those skilled in the art may be used as plasma reactor 24. Some of these plasma reactors are described in J. Mort et al., "Plasma Deposited Thin Films" (CRC Press Inc., Boca Raton, Fla., 1986); "Methods of Experimental Physics," Volume 9—Parts A and B, "Plasma Physics" (Academic Press, New York, 1970/1971); N.H. Burlingame, "Glow Discharge Nitriding of Oxides," Ph.D. thesis (Alfred University, Alfred, N.Y., 1985), available from University Microfilm International, Ann Arbor, Mich. Each of these publications is hereby incorporated by reference into this specification.

In one preferred embodiment, the plasma reactor 24 was "model 56 torch" available from the TAFA Inc. of Concord, N.H. It was operated at a frequency of about 4 megahertz and an input power of 30 kilowatts.

Into feeding lines 30 and 32 is fed plasma gas 26. As is known to those skilled in the art, a plasma can be produced by passing gas into a plasma reactor. A discussion of the formation of plasma is contained in B. Chapman's "Glow Discharge Processes" (John Wiley & Sons, N.Y., 1980), the disclosure of which is hereby incorporated by reference into this specification.

In one preferred embodiment, the plasma gas used is a mixture of argon and oxygen. In another embodiment, the plasma gas is a mixture of nitrogen and oxygen. In yet another embodiment, the plasma gas is pure argon or pure nitrogen.

When the plasma gas is pure argon or pure nitrogen, it is preferred to introduce into the plasma reactor 24 at a flow rate of from about 5 to about 30 liters per minute.

When a mixture of oxgyen and either argon or nitrogen is used, the concentration of oxygen in the mixture should preferably be from about 1 to about 40 volume percent and, preferably, from about 15 to about 25 volume percent. When such a mixture is used, the flow rates of each gas in the mixture should be adjusted to obtain the desired gas concentrations. Thus, by way of illustration, in one embodiment which uses a mixture of argon and oxygen, the argon flow rate was 15 liters per minute, and the oxygen flow rate was 40 liters per minute.

In one embodiment, auxiliary oxygen 34 is fed into the top of reactor 24, between the plasma region 22 and the flame region 40, via lines 36 and 38. In this embodiment, the auxiliary oxygen is not involved in the formation of plasma but is involved in the enhancement of the oxidation of the material.

Radio frequency energy is applied to the reagents in the plasma reactor 24, and it causes vaporization of the mist.

In general, the energy is applied at a frequency of from about 100 to about 30,000 kilohertz. In one embodiment, the radio frequency used is from about 1 to 20 megahertz. In another embodiment, the radio frequency used is from about 3 to about 5 megahertz.

As is known to those skilled in the art, such radio frequency alternating currents may be produced by conventional radio frequency generators. Thus, by way of illustration, said TAPA Inc. "model 56 torch" is attached to a radio frequency generator rated for operation at 35 kilowatts which is manufactured by Lepel Company (a division of TAFA Inc.) and which generates an alternating current with a frequency of 4 megaherz at a power input of 30 kilowatts. Thus, e.g., one may use an induction coil driven at 2.5–5.0 megahertz which is sold as the "PLASMOC 2" by ENI Power Systems, Inc. of Rochester, N.Y.

The use of this type of radio-frequency generator is described in the Ph.D. thesis entitled (1) "Heat Transfer Mechanisms in High-Temperature Plasma Processing of Glasses," Donald M. McPherson (Alfred University, Alfred, N.Y., January, 1988) and (2) the aforementioned Nicholas H. Burlingame's "Glow Discharge Nitriding of Oxides." The disclosure of each of these publications is hereby incorporated by reference into this specification.

The plasma vapor 23 formed in plasma reactor 24 is allowed to exit via the aperture 42 and can be visualized in the flame region 40. In this region, the plasma contacts air which is at a lower temperature than the plasma region 22, and a flame is visible. A theoretical model of the plasma/flame is presented on pages 88 et seq. of said McPherson thesis.

The vapor 44 present in flame region 40 is propelled downwardly towards collector 46.

Collector 46 may consist of any material whose surface will cause vapor 44 to condense and to form powders. Thus, by way of illlustration and not limitation, collector 46 may consist essentially of glass, glass-ceramic material, one or more metals, one or more alloy materials, and the like.

In one preferred embodiment, collector 46 consists essentially of "Pyrex Glass Brand No. 7740" which is a borosilicate glass manufactured by the Corning Glass Works of Corning N.Y.

In another preferred embodiment, collector 46 consists essentially of a "Spray Dried Glass" which is described on page 1.5 of the publication MB-EG-90, "Specialty Glass and Glass Ceramic Materials," published by the Materials Business, Corning Incorporated, Main Plant 21-3, Corning, N.Y.

It is preferred that the collector 46 be larger than flame outlet 42 and, preferably, have a maximum dimension greater than about 6 centimeters.

In one embodiment, collector 46 consists essentially of either a refractory metal and/or a refractory alloy with a melting point in excess of 1,100 degrees centigrade.

Those skilled in the art are well aware of those metals and alloys that have melting points in excess of 1,100 degrees centigrade; see, e.g., pages 23–38 and 43–53 of Robert H. Perry et al.'s "Chemical Engineers' Handbook," Fifth Edition (McGraw-Hill Book Company, New York, 1973). Thus, by way of illustration and not limitation, suitable materials include nickel, molybdenum, tungsten, Hastelloy Alloy B, Incoloy Alloy 800, Nimonic 75, Inconel 600, Monel Alloy 400, and the like.

In one preferred embodiment, the collector 46 contains at least about 40 mole percent of nickel, present either by itself, in mixture, or in an alloy with one or more other elements (such as chromium, molybdenum, tungsten, and the like). It is preferred that the substrate contain at least about 50 mole percent of nickel.

In one embodiment, the collector 46 used is Hastelloy Alloy B, which contains at least about 66 mole percent of nickel, about 28 mole percent of molybdenum, about 5 mole percent of iron, and trace amounts of manganese and silicon.

In another embodiment, the collector 46 used is Hastelloy Alloy C, which contains at least about 58 mole percent of nickel, about 16 mole percent of molybdenum, about 16 mole percent of chromium, about 5 mole percent of iron, about 4 mole percent of tungsten, and trace amounts of manganese and silicon.

In another embodiment, the collector 46 used is Hastelloy Alloy D, which contains about 86 mole percent of nickel, about 10 mole percent of silicon, and, about 3 mole percent of copper, and trace amounts of manganese.

In another embodiment, the collector 46 used is Hastelloy Alloy G, which contains about 44 mole percent of nickel, about 22 mole percent of chromium, about 20 mole percent of iron, about 6.5 mole percent of molybdenum, and minor amounts of tantalum, copper, carbon, and tungsten.

In another embodiment, the collector 46 used is Hastelloy Alloy X which contains about 48 mole percent of nickel, about 22.0 mole percent of chromium, about 18.5 mole percent of iron, about 9.0 mole percent of molybdenum, and minor amounts of cobalt, tungsten, and carbon.

In another embodiment, pure nickel is used.

The collector 46 may be at ambient temperature. Alternatively, one may use additional heating means to heat the collector 46 prior to, during, or after deposition.

In one preferred embodiment, heater 50 is used to heat the substrate to a temperature of from about 100 to about 800 degrees centigrade.

Temperature sensing means 52 may be used to sense the temperature of the substrate and, by feedback means (not shown), adjust the output of heater 50. In one embodiment, not shown, when the substrate 46 is relatively near flame region 40, then optical pyrometry measurement means (not shown) may be used to measure the temperature near the substrate.

In one embodiment, illustrated in FIG. 1, a shutter 54 is used to selectively interrupt the flow of vapor 44 to collector 46. The use of this shutter 54 is important prior to the time the flame region has become stable; and the vapor should not be allowed to impinge upon the collector prior to such time.

The process of this invention allows one to deposit an article at a deposition rate of from about 0.2 milligram to about 200 milligram per minute and, preferably, from about 2 milligram to about 20 milligram per minute, with a collector with an exposed surface of 35 square centimeters. One may determine the deposition rate upon said reference collector material (with an exposed surface of 35 square centimeters) by means well known to those skilled in the art.

The deposition rate can be monitored in situ, while the vapor is being deposited onto the collector. Thus, by way of illustration, one may use an IC-6000 thin film thickness monitor (as referred to as "deposition controller") manufactured by Leybold Inficon Inc. of East Syracuse, N.Y.

In one embodiment, the as-deposited particles produced by the process of this invention consists of uniform, small grains. In this preferred embodiment, at least about 80 volume percent of the particles in the as-deposited film are smaller than about 1 micron. It is preferred that in this embodiment, at least about 90 percent of such particles are smaller than 100 nanometers. Because of this fine grain size, the powder can be utilized to furnish pinning centers for the 1-2-3 material.

Applicant's process provides a substantial amount of flexibility in varying the particle size of the powder material deposited. By varying such factors as the concentration of solution 10 (a higher concentration produces a larger particle size), and/or the pressure of carrier gas 16 (the higher the pressure of gas 16, the faster the deposition rate, and the larger the particle size of the particles produced), the temperature of the collector (the higher the collector temperature, the larger the size of the grains deposited), the radio-frequency energy used (the higher the energy, the larger the grain size deposited), energy supplied by the ultrasonic nebulizer (the greater the energy, the faster the deposition rate), and the like, one may control the properties of the material deposited onto the collector 46.

It is preferred that the generation of the vapor in plasma rector 24 be conducted under substantially atmospheric pressure conditions. As used in this specification, the term "substantially atmospheric" refers to a pressure of at least about 600 millimeters of mercury and, preferably, from about 600 to about 1,000 millimeters of mercury. It is preferred that the vapor generation occur at about atmospheric pressure. As is well known to those skilled in the art, atmospheric pressure at sea level is 760 millimeters of mercury; see, e.g., page 60 of said "A dictionary of mining, mineral, and related terms," supra.

The insulating powder produced by the process of this invention consists essentially of a material of the formula $R_2BaCuO_5$, wherein R is a rare earth element selected from the group consisting of yttrium, gadolinium, lanthanum, europium, and holmium, it being preferred that R is yttrium. See, e.g., pages 181–193 of a book edited by David L. Nelson et al. entitled "Chemistry of High-Temperature Superconductors II" (American Chemical Society, Washington, D.C., 1988).

Referring again to FIG. 1, the solution 10 will preferably contain ions in substantially the stoichiometric ratio needed to form the desired coating. These ions are preferably available in solution 10 in water-soluble form, such as, e.g., in the form of water-soluble salts. Thus, e.g., one may use the nitrates or the chlorides or the sulfates or the phosphates of the cations. Other anions which form soluble salts with the cation(s) also may be used.

Alternatively, one may use salts soluble in solvents other than water. Some of these other solvents which may be used to prepare the material include nitric acid, hydrochloric acid, phosphoric acid, sulfuric acid, and the like. As is well known to those skilled in the art, many other suitable solvents may be used; see, e.g., J. A. Riddick et al., "Organic Solvents, Techniques of Chemistry," Volume II, 3rd edition (Wiley-Interscience, New York, N.Y., 1970), the disclosure of which is hereby incorporated by reference into this specification.

In one preferred embodiment, where a solvent other than water is used, each of the cations is present in the form of one or more its oxides. For example, one may dissolve nickel oxide in nitric acid, thereby forming a nitrate. For example, one may dissolve zinc oxide in sulfuric acid, thereby forming a sulfate. One may dissolve nickel oxide in hydrochloric acid, thereby forming a chloride. Other means of providing the desired cation(s) will be readily apparent to those skilled in the art.

In general, as long as the desired cation(s) are present in the solution, it does not matter that much how it was obtained.

In general, one may use commercially available reagent grade materials. Thus, by way of illustration and not limitation, one may use the following reagents available in the 1988-1989 Aldrich catalog (Aldrich Chemical Company, Inc., Milwaukee, Wis.): yttrium chloride (catalog number 29,826-3), yttrium nitrate tetrahydrate (catalog number 21,723-9), yttrium sulfate octahydrate (catalog number 20,493-5), and the like.

As long as the metals present in the desired powder are present in solution 10 in the desired stoichiometry, it does not matter whether they are present in the form of a salt, an oxide, or in another form. In one embodiment, however, it is preferred to have the solution contain either the salts of such metals, or their oxides.

The solution 10 of the compounds of such metals preferably will be at a concentration of from about 0.01 to about 1,000 grams of said reagent compounds per liter of the resultant solution. As used in this specification, the term liter refers to 1,000 cubic centimeters.

In one embodiment, it is preferred that solution 10 have a concentration of from about 1 to about 300 grams per liter and, preferably, from about 25 to about 170 grams per liter. It is even more preferred that the concentration of said solution 10 be from about 100 to about 160 grams per liter. In an even more preferred embodiment, the concentration of said solution 10 is from about 140 to about 160 grams per liter.

In one preferred embodiment, aqueous solutions of yttrium nitrate, barium nitrate, and copper nitrate, each preferably with a purity of at least 99.9 percent, are mixed in the molar ratio of from about 2/1/1 of yttrium/barium/copper and then dissolved in distilled water to form a solution with a concentration of 150 grams per liter.

The following example is presented to illustrate the claimed invention but is not to be deemed limitative thereof. Unless otherwise specified, all parts are by weight and all temperatures are in degrees centigrade.

EXAMPLE 1

29.6 grams of yttrium nitrate pentahydrate, 10.6 grams of barium nitrate, and 9.8 grams of copper nitrate trihydrate were mixed with 500 milliliters of distilled water. About one-third of this solution was then poured into a hemispherical plastic mist chamber with a capacity of 200 cubic centimeters which was equipped with a gas inlet and a mist outlet.

The mist chamber containing the solution was placed onto the aforementioned DeVilbiss ultrasonic nebulizer generator described in the specification; the ultrasonic generator was operated at a power of 70 watts and a frequency of 1.63 megahertz; the misting droplets formed were from about 0.5 to about 5.0 microns diameter in size. The gas inlet of the chamber was connected to a source of argon flowing at a rate of approximately 100 milliliters per minute.

The output from the misting chamber was connected to the TAFA plasma reactor equipped with the Lepel radio frequency generator, both of which are described in the specification. The Lepel radio frequency generator was operated at a power of 30 kilowatts and produced an alternating current of 4 megahertz. Argon gas was introduced into the bottom portion of the plasma reactor; the argon flow rate was 30 liters per minute.

The distance between the top of the plasma reactor and the collector was 5 centimeters. In this example, the collector used was bowl with a maximum diameter (at its top) of about 15 centimeters which consisted essentially of glass-ceramic material.

The vapor from the plasma reactor was deposited onto the interior surface of the bowl over a period of 30 minutes. Thereafter, the powder so deposited was scraped off of such interior surface and subjected to X-ray diffraction analysis; this analysis indicated the presence of the desired 2-1-1 phase. The international card number corresponding to the phase obtained is 38-1434.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

I claim:

1. A process for preparing an insulating powder with a particle size of less than 100 nm, consisting essentially of a material of the formula $R_2BaCuO_5$, wherein R is a rare earth element selected from the group consisting of yttrium, gadolinium, lanthanum, europium, and holium, comprising the steps of: =9

(a) providing a solution comprised of a first compound, a second barium compound, and a third copper compound, wherein:
   1. said first compound is selected from the group consisting of an yttrium compound, a gadolinium compound, a lanthanum compound, a europium compound, a holmium compound, and mixtures thereof,
   2. said first compound, said barium compound, and said copper compound are present in said solution in the molar ratio of 2:1:1 of R/barium/copper, wherein said solution is comprised of from about 0.01 to about 1,000 grams of a mixture consisting essentially of said first compound, said barium compound, and said copper compound per liter of said solution;

(b) subjecting said solution to ultrasonic sound waves at a frequency in excess of 20,000 hertz, and to a substantially atmospheric pressure of at least about 600 millimeters of mercury, thereby causing said solution to form into an aerosol;

(c)providing a radio frequency plasma reactor;

(d)generating a plasma gas within said radio frequency reactor;

(e) contacting said aerosol with said plasma gas within said plasma reactor while subjecting said aerosol to a substantially atmospheric pressure of at least about 600 millimeters of mercury and to a radio frequency alternating current at a frequency of from about 100 kilohertz to about to about 30 megahertz, thereby forming a vapor;

(f) flowing said vapor downwardly onto the surface of a collector; and (g) condensing said vapor onto said surface of said collector.

2. The process as recited in claim 1, wherein said first compound is an yttrium compound.

3. The process as recited in claim 2, wherein said vapor is condensed on said surface of said collector at a rate of from about 0.2 to about 200 milligrams per minute per 35 square centimeters of said surface.

4. The process as recited in claim 2, wherein said vapor is condensed on said surface of said collector at a rate of from about 2 to about 20 milligrams per minute per 35 square centimeters of said surface.

5. The process as recited in claim 4, wherein said collector consists essentially of glass.

6. The process as recited in claim 5, wherein said glass is borosilicate glass.

7. The process as recited in claim 3, wherein said collector consists essentially of a material comprising at least about 40 mole percent of nickel.

8. The process as recited in claim 7, wherein said collector consists essentially of a nickel alloy.

9. The process as recited in claim 8, wherein said nickel alloy is comprised of molybdenum.

10. The process as recited in claim 9, wherein said nickel alloy is comprised of chromium.

* * * * *